United States Patent
Muramatsu et al.

(10) Patent No.: US 6,404,214 B1
(45) Date of Patent: Jun. 11, 2002

(54) SUBSTRATE FOR INSPECTING ELECTRONIC DEVICE, METHOD OF MANUFACTURING SUBSTRATE, AND METHOD OF INSPECTING ELECTRONIC DEVICE

(75) Inventors: Shigetsugu Muramatsu; Michio Horiuchi; Takuya Kazama, all of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/468,060

(22) Filed: Dec. 20, 1999

(30) Foreign Application Priority Data

Dec. 21, 1998 (JP) .......................... 10-361758

(51) Int. Cl.⁷ .............................................. G01R 31/02
(52) U.S. Cl. ........................................ 324/754; 324/757
(58) Field of Search .............................. 439/55, 65, 66, 439/68, 76.1, 78, 85, 84; 324/754, 765, 757, 758, 760

(56) References Cited

U.S. PATENT DOCUMENTS

| | | | |
|---|---|---|---|
| 5,410,807 A | 5/1995 | Bross et al. | 29/843 |
| 5,688,128 A | 11/1997 | Ikeya | 439/73 |
| 6,046,598 A | * 4/2000 | Miyaji et al. | 324/755 |
| 6,147,505 A | * 11/2000 | Ott et al. | 324/754 |

FOREIGN PATENT DOCUMENTS

| | | |
|---|---|---|
| EP | 0 453 716 | 10/1991 |
| EP | 0 965 846 | 12/1999 |
| WO | WO 99/01775 | 1/1999 |
| WO | WO 99/21227 | * 4/1999 |
| WO | WO 00/11920 | 3/2000 |

* cited by examiner

Primary Examiner—Safet Metjahic
Assistant Examiner—E P LeRoux
(74) Attorney, Agent, or Firm—Pennie & Edmonds LLP

(57) ABSTRACT

A substrate for inspecting an electronic device used for an electrical test of the electronic device having bump-shaped connection terminals, comprises: opening sections, the diameter of each opening being determined so that a connection terminal can be inserted into and drawn out from the opening, are formed penetrating the insulating substrate in a region on one side of an insulating substrate on which the electronic device is mounted, corresponding to an arrangement of the connection terminals; and wiring patterns, each of which is composed of a pad section being exposed onto a bottom face of the opening so that the pad can come into contact with the connection terminal so as to accomplish electrical continuity, a connecting pad section formed in a region outside of the region in which the pad section is formed, which comes into contact with a contact terminal of an inspection device so as to accomplish electrical continuity, and a wiring section for electrically connecting the pad section with the connecting pad section, are formed on the other side of the insulating substrate.

23 Claims, 10 Drawing Sheets

SUBSTRATE FOR INSPECTING ELECTRONIC DEVICE, METHOD OF MANUFACTURING SUBSTRATE, AND METHOD OF INSPECTING ELECTRONIC DEVICE

BACKGROUND OF THE INVENTION

1. Field of the Invention

The present invention relates to a substrate used for electrically inspecting an electronic device such as a semiconductor chip or a chip-size package. Also, the present invention relates to a method of manufacturing the substrate used for inspection and a method of inspecting the electronic device.

2. Description of the Related Art

Before electronic devices such as semiconductor chips or chip-size packages are provided, they are subjected to electrical tests such as an electrical continuity test, a burn-in test and so forth. An exclusive inspection socket has been conventionally used for the inspection device to inspect the above electronic devices.

FIG. 10 is a view showing an example of the inspection socket used for inspecting PGA (pin grid array) type products. In the drawing, reference numeral 60 is a PGA type electronic device, reference numeral 62 is a contact terminal arranged on the inspection device side, and reference numeral 64 is a cam lever which is a portion of a mechanism for closing an opening of the contact terminal 62.

In the inspection socket, there are provided cylindrical contact terminals 62, the positions of which are made to agree with lead pins 60a arranged in the electronic device 60. After the lead pins 60a have been positioned and inserted into the contact terminals 62, the cam lever is rotated so that the opening of the contact terminal 62 is closed. Due to the foregoing, the lead pins 60a and the contact terminals 62 can be positively electrically connected with each other for inspection.

As described above, the inspection socket for inspecting the PGA type electronic device is composed in such a manner that the lead pins are inserted into and drawn out from the contact terminals 62 so that the electronic device can be electrically connected with the inspection device for the electrical test. On the other hand, the inspection socket for inspecting the BGA (ball grid array) type electronic device is composed in such a manner that contact terminals having spring properties are arranged in the inspection socket according to an arrangement of connection terminals such as bumps, the electronic device is put on the inspection socket, and the inspection device and the electronic device are electrically connected with each other for inspection while the connection terminals of the electronic device are being pushed against the contact terminals.

In this connection, in the case of an electronic device such as a flip chip type semiconductor chip or a chip size package, the connecting terminals such as bumps and solder balls are arranged very densely. Therefore, when these electronic devices are inspected with the conventional inspection socket in the same manner as that of the type conventional inspection socket for inspecting the PGA or BGA semiconductor device in which the contact terminals are formed according to the arrangement of the connecting terminals, the following problems may be encountered. The contact terminals must be formed very densely according to the arrangement of the connecting terminals of the electronic device. Therefore, it is very difficult to manufacture the inspection socket.

SUMMARY OF THE INVENTION

It is an object of the present invention to provide a substrate used for electrically inspecting an electronic device by which even an electronic device such as a flip chip type semiconductor chip or a chip-size package, the connecting terminals of which are very densely arranged, can be positively tested. It is another object of the present invention to provide a preferable method of manufacturing the substrate for inspection. It is still another object of the present invention to provide a method of inspecting the electronic device.

In order to accomplish the above objects, the present invention is composed as follows.

The present invention provides a substrate for inspecting an electronic device used for an electrical test of the electronic device having bump-shaped connection terminals, comprising: opening sections, the diameter of each opening of which is determined so that the connection terminal can be inserted into and drawn out from the opening, are formed penetrating the insulating substrate in a region on one side of an insulating substrate on which the electronic device is mounted, corresponding to an arrangement of the connection terminals; and wiring patterns, each of which is composed of a pad section being exposed onto a bottom face of the opening so that the pad can come into contact with the connection terminal so as to accomplish electrical continuity, a connecting pad section formed in a region outside of the region in which the pad section is formed, which comes into contact with a contact terminal of an inspection device so as to accomplish electrical continuity, and a wiring section for electrically connecting the pad section with the connecting pad section, are formed on the other side of the insulating substrate.

The present invention provides a substrate for inspecting an electronic device in which the other side of the insulating substrate is covered with an insulating film, and the connecting pad section is exposed.

The present invention provides a substrate for inspecting an electronic device in which the region on the other side of the insulating substrate, in which the pad section is formed, is covered with an elastic material layer.

The present invention provides a substrate for inspecting an electronic device in which an outside of the elastic substance layer is supported by a support member.

The present invention provides a substrate for inspecting an electronic device in which a region on one side of the insulating substrate outside of the region in which the opening section is formed is supported by a reinforcing member.

The present invention provides a substrate for inspecting an electronic device in which a connecting bump is formed on the connecting pad section.

The present invention provides a substrate for inspecting an electronic device in which a lead pin is joined to the connecting pad section.

The present invention provides a method of manufacturing a substrate for inspecting an electronic device comprising the steps of: forming opening sections, the diameter of each opening being determined so that a connection terminal can be inserted into and drawn out from the opening, in a region, on which the electronic device is mounted, on one side of an insulating substrate having a conductor layer on the other side, corresponding to an arrangement of the connection terminals, when a substrate for inspection used for electrically testing an electronic device having a bump-shaped connection terminal is manufactured; exposing the conductor layer onto a bottom face of the opening section; covering a surface of the conductor layer on the other side of the insulating substrate with photosensitive resist; forming a resist pattern by exposing and developing photosensitive resist, the resist pattern covering a pad section exposed onto a bottom face of the opening section and coming into contact with the connecting terminal so that it can be electrically connected, the resist pattern also covering a connecting pad section formed in a region outside of the region in which the pad section is formed, the connecting pad section coming into contact with a contact terminal of an inspection device so as to accomplish electrical continuity, the resist pattern also covering a wiring pattern composed of a wiring section for electrically connecting the pad section and the connecting pad section; and forming a wiring pattern composed of the pad section, connecting pad section and wiring section when a portion in which the conductor layer is exposed is removed by means of etching while the resist pattern is being used as a mask.

The present invention provides a method of manufacturing a substrate for inspecting an electronic device, wherein the opening section is formed when laser beams are irradiated from one face side of the insulating substrate.

The present invention provides a method of inspecting an electronic device comprising the steps of: putting an electronic device, which is a body to be inspected, on a substrate for inspection after the connecting terminals of the electronic device and the opening section of the substrate for inspection have been suitably positioned; pressing the connecting terminals of the electronic device to the pad section exposed onto the bottom face of the opening section so as to accomplish electric continuity; and pressing the connecting pad section of the substrate for inspection to the contact terminals of the inspection device so as to accomplish electric continuity, so that the electronic device and the inspection device can be electrically connected with each other via the substrate for inspection of the electronic device and a predetermined electric test can be made.

As described above, according to the substrate for inspecting an electronic device of the present invention, even an electronic device such as a flip-chip type semiconductor chip and a chip-size package, in which the connecting terminals are very densely arranged at minute intervals, can be easily and positively tested and inspected with an inspection device.

According to the method of manufacturing a substrate for inspection of the present invention, the opening section is formed in accordance with the arrangement of the connecting terminals, and a predetermined wiring pattern can be formed by etching the conductor layer. Therefore, it is possible to easily manufacture a substrate for inspection preferably used for inspecting an electronic device in which the connecting terminals are very densely arranged.

According to the method of inspecting an electronic device of the present invention, when the substrate for inspecting an electronic device is used, the electronic device can be tested and inspected with a socket for inspection used in the conventional inspection device. Therefore, even an electronic device such as a flip-chip type semiconductor chip and a chip-size package, in which the connecting terminals are very densely arranged, can be easily and positively tested and inspected with an inspection device.

DESCRIPTION OF THE PREFERRED EMBODIMENT

Referring to the appended drawings, a preferred embodiment of the present invention will be explained in detail as follows.

Figure 1:
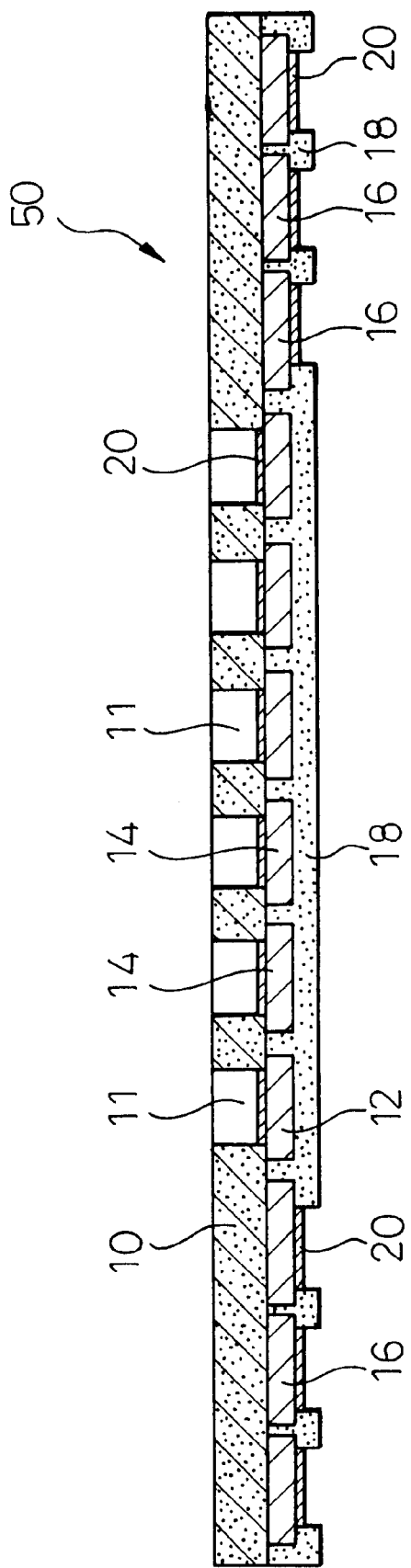
FIG. 1 is a cross-sectional view showing an embodiment of a substrate for inspecting an electronic device.

FIG. 1 is a cross-sectional view showing an embodiment of the substrate for inspecting an electronic device of the present invention. This substrate for inspection is composed of an insulating substrate 10, the plan size of which is larger than the electronic device to be inspected such as a semiconductor chip. This insulating substrate 10 is a base body. There is provided an electronic device on one side of the insulating substrate 10. There is also provided a wiring pattern 12 for electrically connecting the electronic device to be inspected with an inspection device arranged on the other side of the insulating substrate 10.

Reference numeral 11 is an opening section provided on one side of the insulating substrate 10. Openings of the opening section 11 are arranged in the same plan arrangement as that of the connecting terminals of the electronic device, and the diameter of each opening is determined so that the connecting terminal can be freely inserted into and drawn out from the opening.

The wiring pattern 12 provided on the other side of the insulating substrate 10 includes: a pad section 14 electrically connected with the connecting terminals of the electronic device; a connecting pad section 16 electrically connected with the contact terminals of an inspection device; and a wiring section electrically connecting the pad section 14 with the connecting pad section 16.

The pad section 14 is provided in such a manner that it is exposed to a bottom face of the opening section 11 formed on the insulating substrate 10. In the case of inspection, the electronic device is put on one side of the insulating substrate 10, so that the electronic device can be inspected. At this time, the connecting terminals of the electronic device come, under pressure, into contact with the pad section 14 on the bottom face of the opening section 11, so that the connecting terminals and the pad section 14 are electrically connected with each other. Therefore, the thickness of the insulating substrate 10 must be set so that the connecting terminals inserted into the opening section 11 can come, under pressure, into contact with the pad section 14.

The pad section 14 is arranged in the central region of the insulating substrate 10, and the connecting pad section 16 is arranged outside of the region in which the pad section 14 is arranged. The pad section 14 is very densely arranged, because the plane arrangement of the pad section 14 is the same as that of the connecting terminals of the electronic device. On the other hand, since the connecting pad section 16 is electrically connected with the contact terminals of an inspection device, the connecting pad section 16 may be arranged in the same plan arrangement as that of the contact terminals of the inspection device. Therefore, the connecting pad section 16 can be arranged while predetermined intervals are maintained in the arrangement. It is possible to ensure a large space in the outside region in which the connecting pad section 16 is arranged. Accordingly, the connecting pad sections 16 can be arranged at sufficiently large intervals in accordance with the inspection device.

Figure 2:
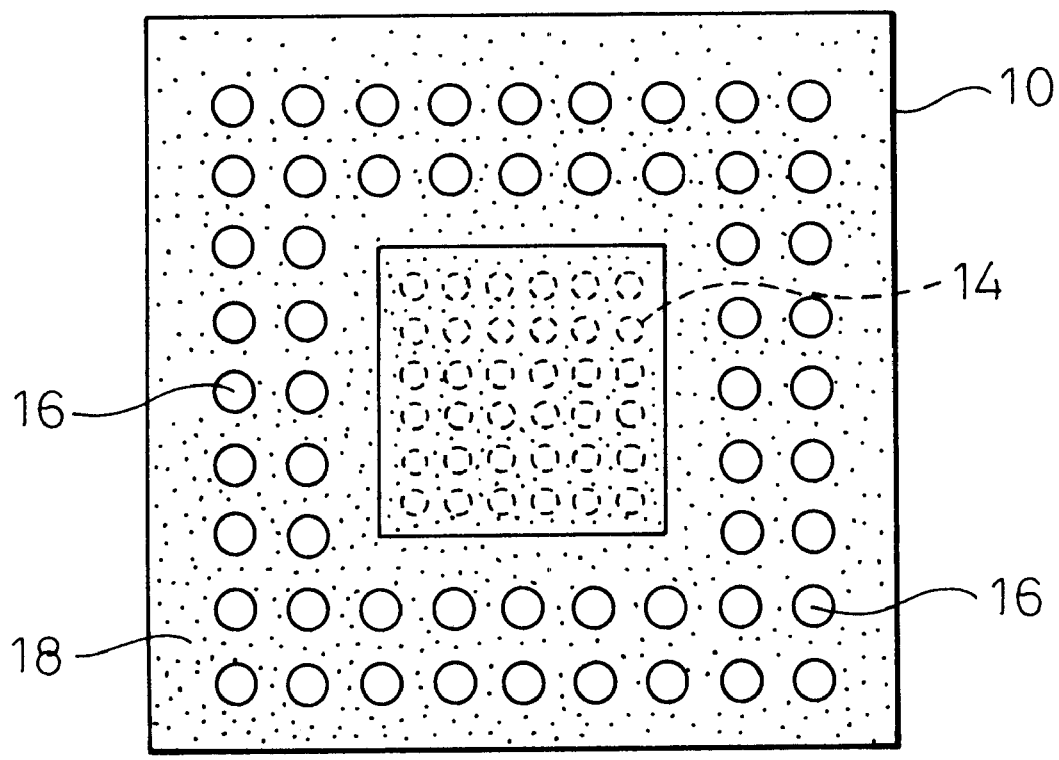
FIG. 2 is a bottom face view of a substrate for inspecting an electronic device.

FIG. 2 is a view showing a substrate for inspection, wherein the view is taken from the bottom side on which the connecting pad section 16 is formed. The pad section 14 is arranged at the center of the insulating substrate 10, and the connecting pad section 16 is arranged outside of the region in which the pad section 14 is arranged.

The face (the other face) of the insulating substrate 10 on which the wiring pattern 12 is provided is covered with an insulating film 18 made of solder resist in such a manner that only the connecting pad section 16 is exposed. As shown in FIG. 1, the face of the pad section 14 which is exposed on to the other face of the insulating substrate 10 is covered with the insulating film 18. In FIG. 1, reference numeral 20 is a surface plating layer for protecting exposed faces of the pad section 14 and the connecting pad section 16.

FIGS. 3(a) to 3(e) are views showing a method of manufacturing the substrate for inspection of the above embodiment.

Figure 3A:
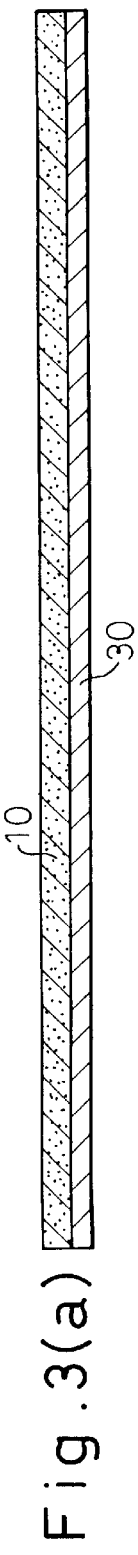
FIGS. 3(a) to 3(e) are schematic illustrations showing a method of manufacturing a substrate for inspecting an electronic device.
Figure 3B:
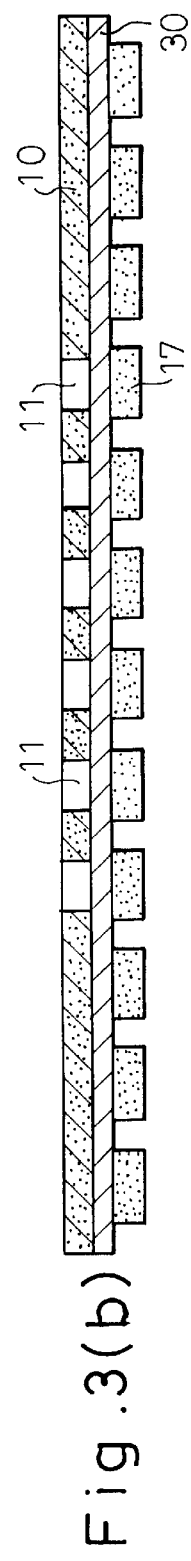

FIG. 3(a) is a view showing an insulating substrate 10, on one side of which a layer of copper foil 30 is provided, wherein this side becomes the other side of the insulating substrate 10. The insulating substrate 10 is a base body of the substrate for inspection and made of insulating resin such as glass, epoxy and resin to which glass fiber is added. FIG. 3(b) is a view showing a state in which the opening section 11 is formed on the insulating substrate 10 by irradiating laser beams onto the insulating substrate 10, on one side of which the layer of copper foil is provided, from the side on which the electronic device is mounted. As described before, the opening section 11 is arranged in the same plane arrangement as that of the connecting terminals of the electronic device such as a semiconductor chip, and the diameter of each opening of the opening section 11 is formed so that the connecting terminal can be freely inserted into and drawn out from each opening. Depending upon the material of the insulating substrate 10, it is possible to form the opening section 11 by an etching method on another method instead of the laser irradiating method.

Figure 3C:
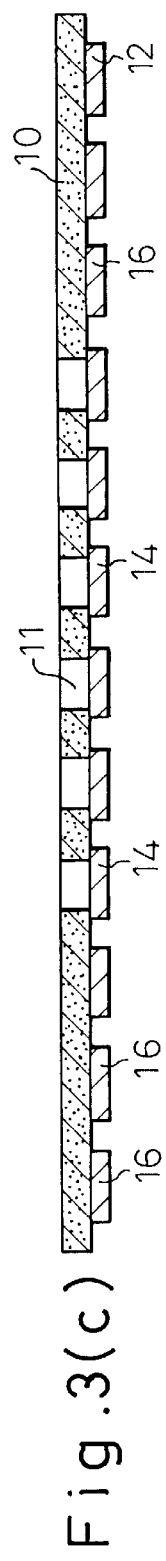

FIG. 3(c) is a view showing a state in which the layer of copper foil 30 is etched in a predetermined pattern so as to form a wiring pattern 12. In this case, the layer of copper foil 30 is etched by a common method of photolithography as follows. A surface of the layer of copper foil 30 is covered with a layer of photosensitive resist. The layer of photosensitive resist is exposed to light and developed in a predetermined pattern, so that a resist pattern 17 is formed which covers the pad section 14 and the connecting pad section 16 and also covers the wiring section for electrically connecting the pad section 14 with the connecting pad section 16 as shown in FIG. 3(b). Portions in which the layer of copper foil 30 is exposed are removed by means of etching by using the resist pattern 17 as a mask. In this way, the wiring pattern 12 is formed.

Figure 3D:
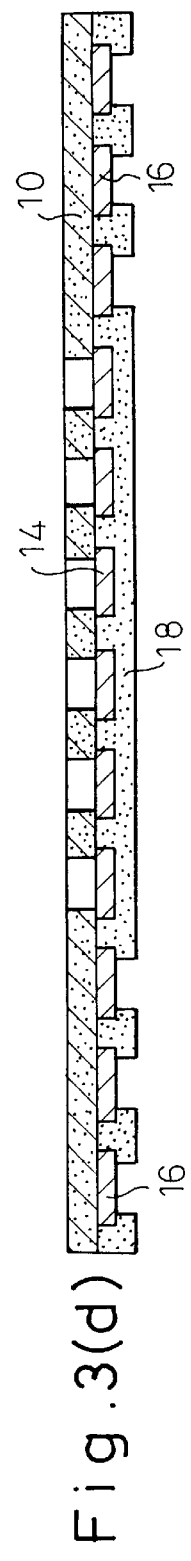

FIG. 3(d) is a view showing a state in which a surface of the wiring pattern 12 on the insulating substrate 10 is covered with the insulating film 18. An example for covering the surface of the wiring pattern 12 with the insulating film 18 is described as follows. The surface of the wiring pattern 12 on the insulating substrate 10 is coated with photosensitive solder resist, and exposure and development are conducted so that only the connecting pad section 16 can be exposed. Due to the foregoing, only the connecting pad section 16 is exposed, and the surface of the wiring pattern 12 on the insulating substrate 10 is covered with the insulating film 18.

Figure 3E:
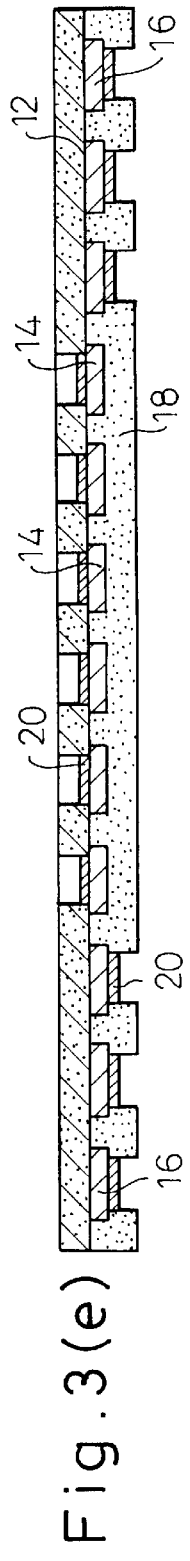

FIG. 3(e) is a view showing a state in which nickel plating and gold plating are successively conducted, on the exposed faces of the pad section 14 and the connecting pad section 16, by means of electrolytic plating so that the surface plating layer 20 is provided. When this surface plating layer 20 is provided, an electrical feed pattern for plating, which is electrically connected with all wiring patterns 12, may be utilized.

In this way, the substrate for inspection shown in FIG. 1 is obtained.

The above method of manufacturing a substrate for inspection is characterized in that: the opening section 11 is provided on the insulating substrate 10 and the wiring pattern 12 is formed by etching the layer of copper foil 30. When a circuit substrate used for a semiconductor device is manufactured, in order to electrically connect the wiring pattern provided on one face on which the semiconductor chip is mounted with the wiring pattern on the other face to which the external connecting terminals such as solder balls are joined, it is common that through-holes are formed on the substrate and plating is conducted on inner faces of the through-holes. However, in the case of the substrate for inspection of this embodiment, only the opening section 11 is formed on the insulating substrate 10, and it is unnecessary to conduct plating on the inner wall faces of the through-holes for electrically connecting the wiring pattern with the external connecting terminals, and even in the case where the wiring pattern 12 is formed, the wiring pattern 12 can be formed only by ething the layer of copper foil 30. when the opening section 11, through which the connecting terminals of the electronic device are inserted and drawn out, is formed, it is possible to form the fine opening section 11, that is, even a substrate for inspection used for inspecting the electronic device such as a flip chip type semiconductor chip and a chip size package, in which the connecting terminals are very densely arranged, can be easily manufactured.

Figure 4:
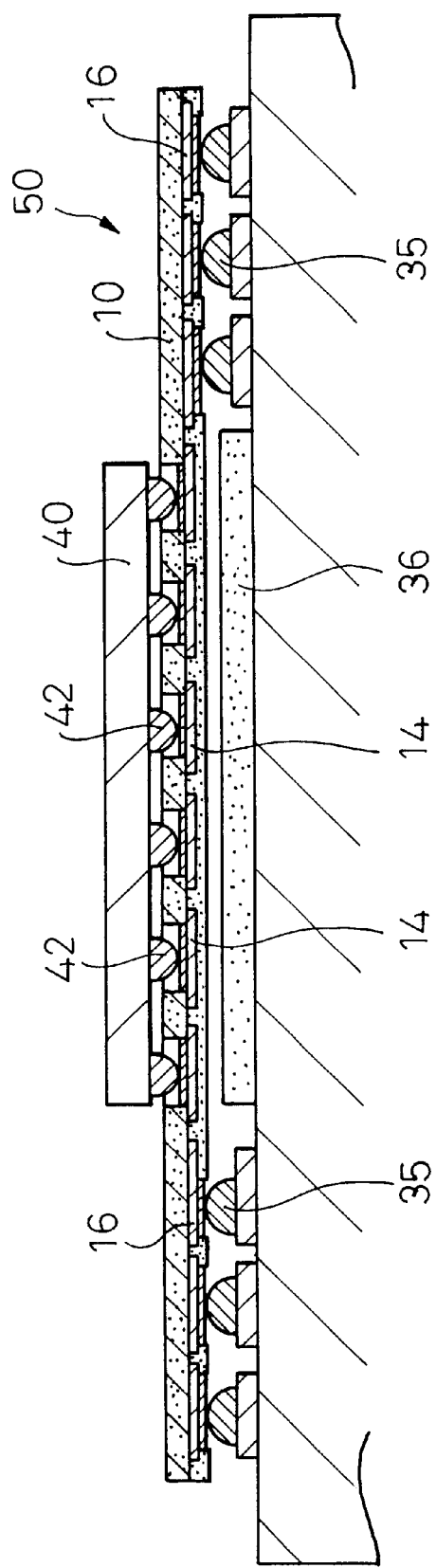
FIG. 4 is a schematic illustration showing a method of inspecting an electronic device with a substrate for inspection.

In the case where the electronic device such as a semiconductor chip is inspected with the substrate for inspection shown in FIG. 1, as shown in FIG. 4, the connecting pad section 16 and the contact terminals 35 are suitably positioned, and the substrate 50 for inspection on which the electronic device 40 is mounted is set on an inspection device so as to test the electronic device 40. The electronic device 40 shown in the drawing is a flip chip type semiconductor chip, the connecting terminals of which are composed of bumps 42. Therefore, when the bumps 42 come, under pressure, into contact with the pad section 14, the semiconductor device 40 and the inspection device can be electrically connected with each other and the electronic device 40 can be tested. Reference numeral 36 is a buffer arranged on the inspection device side, and the pushing force can be reduced by the action of this buffer. That is, this buffer is provided for positively pushing the electronic device 40 onto the substrate 50 for inspection when the electronic device 40 is tested.

Concerning the method of pushing the electronic device 40 onto the substrate 50 for inspection so as to positively conduct inspection, there are provided two methods. One is a method in which the electronic device 40 is elastically pushed from an upper position of the electronic device 40 with a pushing plate. The other is a method in which upper faces of the electronic device 40 and the substrate 50 for inspection are covered with a film, and vacuum suction is conducted from the lower face side, so that the electronic device 40 can be pressed by the suction pressure.

In the case where the electronic device and the substrate for inspection are connected with each other by vacuum suction, it becomes possible that the electron device, which is in a sealed state, can be carried as a packed electronic device elsewhere after inspection.

Figure 5:
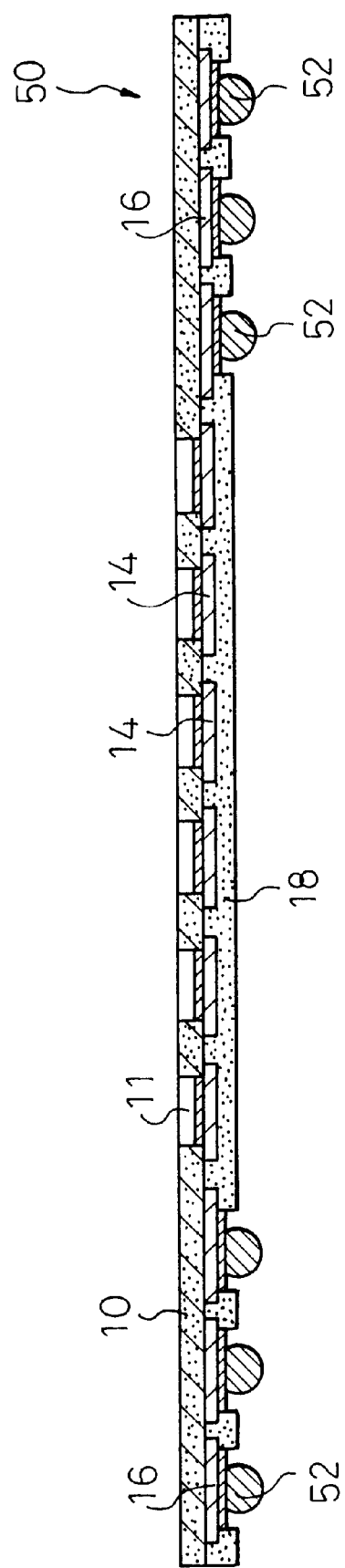
FIG. 5 is a cross-sectional view showing another embodiment of a substrate for inspecting an electronic device.
Figure 6:
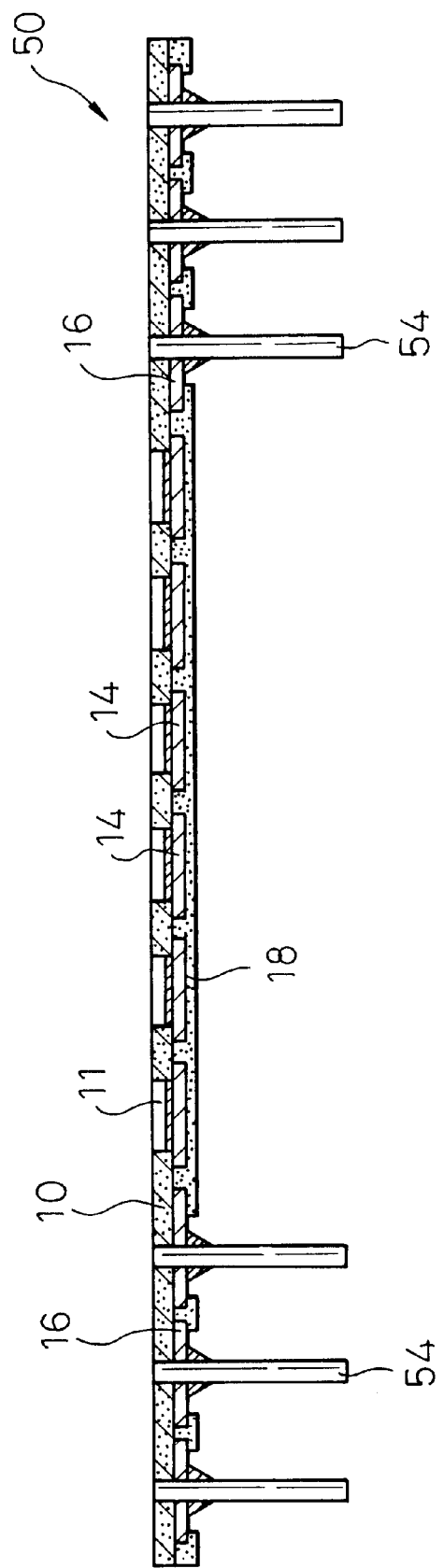
FIG. 6 is a cross-sectional view showing still another embodiment of a substrate for inspecting an electronic device.

The substrate 50 for inspection shown in FIG. 4 is composed in such a manner that the connecting pad section 16 is exposed as a flat face, and the contact terminals 35 of the inspection device are made to come, under pressure, into contact with the connecting pad section 16 so as to accomplish electrical continuity between the inspection device and the electronic device 40. In this case, as shown in FIGS. 5 and 6, it is possible to use the substrate 50 for inspection on which the connecting bumps 52 or the lead pins 54 are previously joined to the connecting pad section 16.

In the case of the substrate 50 for inspection to which the connecting bumps 52 or the lead pins 54 are joined, the pitch of the connecting bumps 52 or the lead pins 54 can be made approximately the same as that of the conventional semiconductor device. Therefore, the conventional socket for inspection used for the test of the semiconductor device can be used as it is.

When the connecting bumps 52 or the lead pins 54 are joined to the connecting pads 16, the method of reflowing solder is usually adopted. In this connection, in the case where the lead pins 54 are supported by being raised on the insulating substrate 10, insertion holes into which the lead pins 54 are inserted may be formed on the insulating substrate 10 by means of drilling. In this case, the insertion holes penetrate the pad section 16.

The substrate for inspection of the present invention has a function of conversion by which the pitch of the connecting pad section can be extended so that even the electronic device 40, the pitch of the connecting terminals of which is short, can be applied to the conventional socket for inspection. Due to the foregoing, an electronic device such as a flip chip type semiconductor chip and a chip size package in which the connecting terminals are arranged at very fine intervals can be easily tested with the conventional socket for inspection.

The structure of the substrate 50 for inspection is simple. Therefore, the substrate 50 for inspection can be easily manufactured, and further a very fine pattern can be formed on substrate 50 for inspection as described before. Accordingly, the substrate 50 for inspection is advantageous in that even an electronic device, the electrical test of which is difficult when the conventional socket for inspection is used, can be tested.

Figure 7:
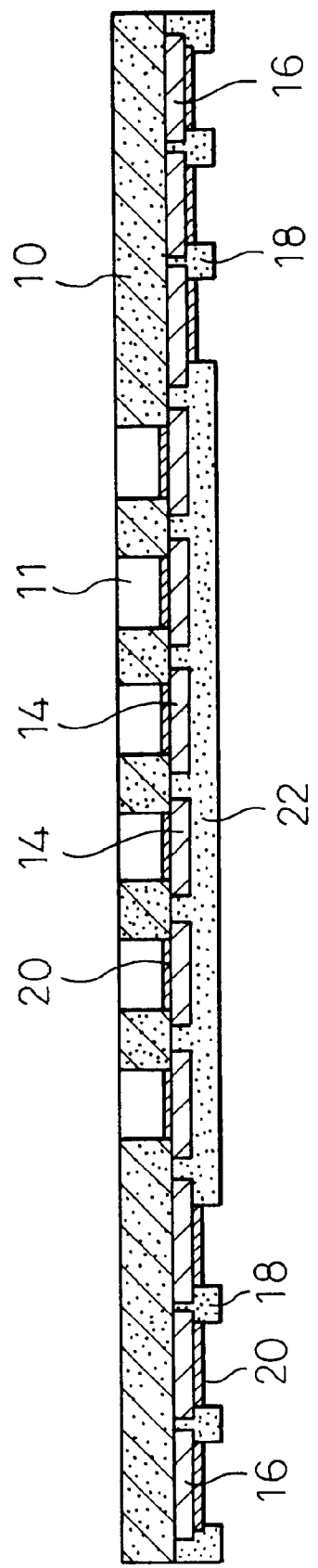
FIG. 7 is a cross-sectional view showing still another embodiment of a substrate for inspecting an electronic device.
Figure 8:
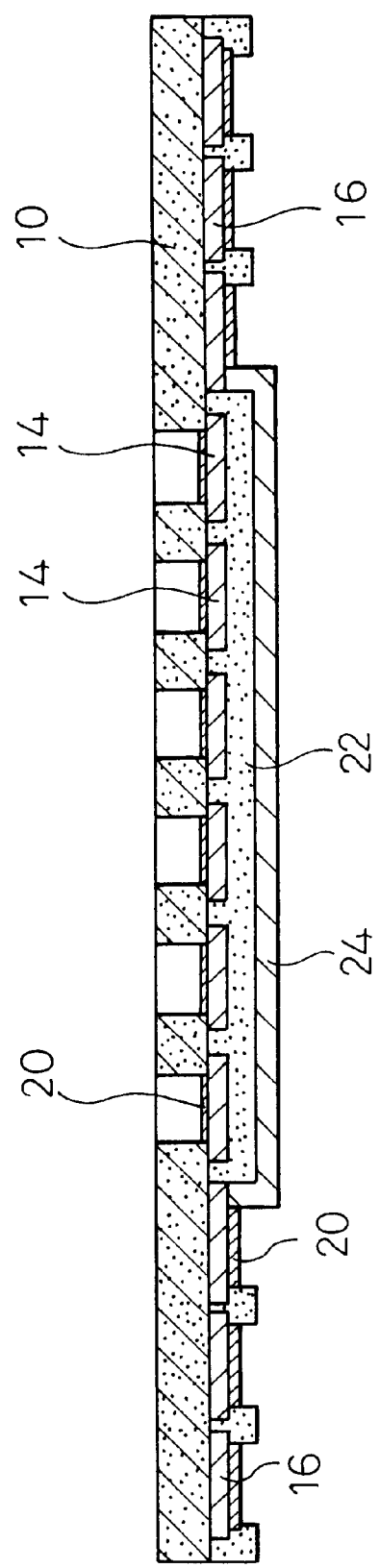
FIG. 8 is a cross-sectional view showing still another embodiment of a substrate for inspecting an electronic device.
Figure 9:
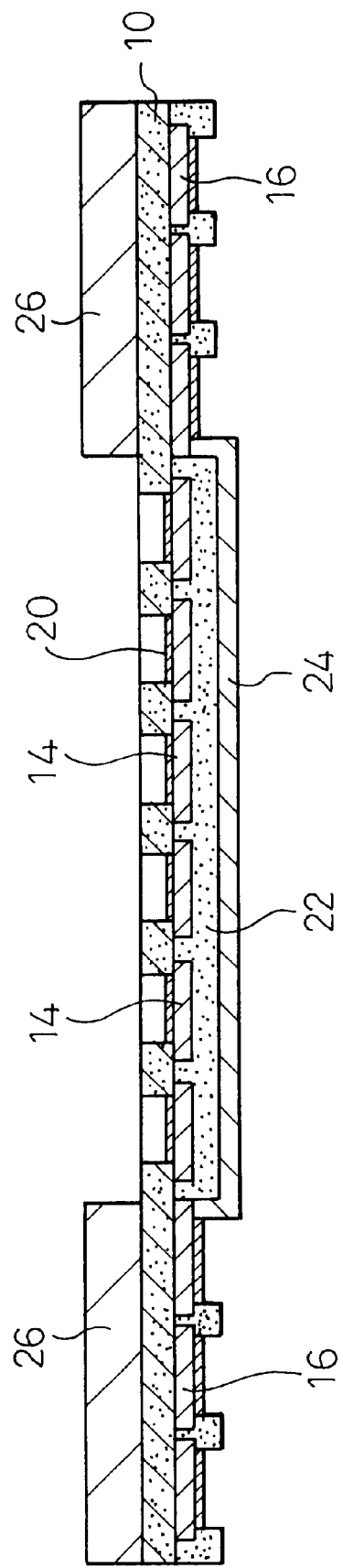
FIG. 9 is a cross-sectional view showing still another embodiment of a substrate for inspecting an electronic device.
Figure 10:
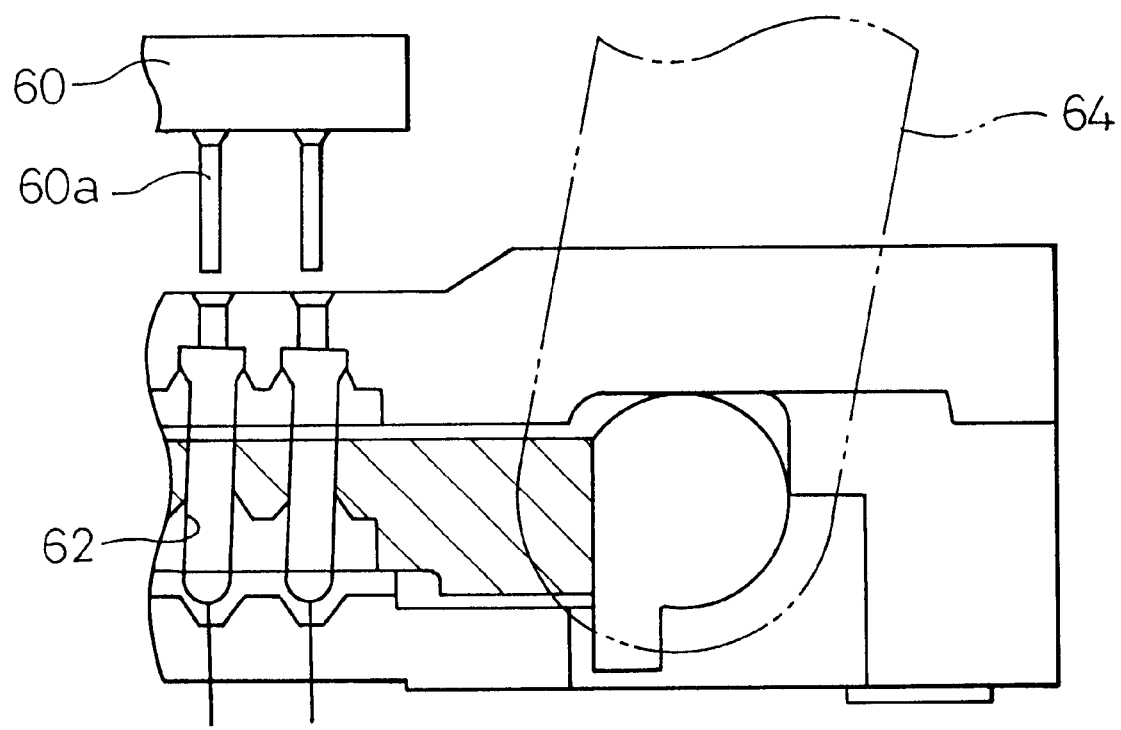
FIG. 10 is a schematic illustration showing a conventional method of inspecting an electronic device with a socket for inspection.

FIGS. 7 to 9 are views showing another embodiment of the substrate for inspection.

The substrate for inspection shown in FIG. 7 is characterized in that an external face of the region in which the pad section 14 is arranged is covered with an elastic layer 22 which is formed by coating elastic material such as elastomer. The opening section 11, the pad section 14 and the connecting pad section 16 on this substrate for inspection are entirely the same as those of the embodiment shown in FIG. 1.

The substrate for inspection of this embodiment is manufactured in such a manner that the wiring pattern 12 is covered with the insulating film 18 and then the region in which the pad section 14 is arranged is coated with elastic material so as to form an elastic layer 22 in the manufacturing process of manufacturing the substrate for inspection shown in FIG. 3.

The substrate for inspection of this embodiment, in which a portion on which the electronic device 40 is mounted is supported by the elastic layer 22, is advantageous as follows. When the electronic device 40 is put on the substrate for inspection and pressed against the substrate for inspection, the connecting terminals to be inspected are positively pressed against the pads of the pad section 14. Therefore, it is possible to positively accomplish an electrical connection. Accordingly, the test and inspection can be positively carried out.

The substrate for inspection shown in FIG. 8 is characterized in that the support member 24 is made to adhere onto an external face of the elastic layer 22 in the embodiment shown in FIG. 7. The support layer 24 is provided for supporting the elastic layer 22 when it tends to be deformed. For example, the external face of the elastic layer 22 is covered with metal or resin so that the elastic layer 22 cannot be deformed.

When the elastic layer 22 is reinforced by the support member 24 as described above, the elastic layer 22 may be made of material, the elastic modulus of which is low, such as silicone resin. When the elastic modulus of the elastic layer 22 is low as described above, the connecting terminals 42 of the electronic device 40 and the pad section 14 can be more positively electrically connected with each other.

The substrate for inspection shown in FIG. 9 is an example in which the entire insulating substrate 10 is reinforced by attaching the reinforcing member 26 to the periphery of the insulating substrate 10 which is not reinforced by the support member 24 in the embodiment shown in FIG. 8.

The insulating substrate 10 is made of insulating resin as described before. When the insulating substrate 10 is composed of a film-shaped member, the configuration of the substrate 10 cannot be maintained, and it is impossible to put it into contact with an object to be inspected. Therefore, it is preferable that the insulating substrate 10 is reinforced by the reinforcing member 26 such as a metal plate or resin plate which is different from the insulating substrate 10 as described in this embodiment.

As long as the insulating substrate 10 is reinforced by the reinforcing member 26, the insulating substrate 10 can be used as a substrate for inspection which causes no problems in the processes of transportation and operation.

In this connection, in the embodiment shown in FIG. 9, the region in which the pad section 14 is arranged is reinforced by the support member 24. However, even when the region in which the pad section 14 is arranged is not reinforced by the support member 24, it is effective that the periphery of the insulating substrate 10 on the side on which the electronic device is mounted is reinforced by the reinforcing member 26.

What is claimed is:

1. A substrate for inspecting an electronic device used for an electrical test of the electronic device having bump-shaped connection terminals, comprising:

an insulating substrate comprising first and second sides and first and second sections, and opening sections, the diameter of each opening being determined so that the connection terminal can be inserted into and drawn out from the opening, penetrating the insulating substrate on the first side of the first section of the insulating substrate, on which the electronic device is mounted, said openings corresponding to an arrangement of the connection terminals; and wiring patterns, each of which is composed of a pad section being exposed onto a bottom face of the opening so that the pad can come into contact with the connection terminal so as to accomplish electical continuity, a connecting pad section disposed in the second section, which is adapted to contact a contact terminal so as to accomplish electrical continuity, a wiring section for electrically connecting the pad section with the connecting pad section, and a first elastic material layer disposed in the first section, each disposed on the second side of the insulating substrate.

2. A substrate for inspecting an electronic device according to claim 1, wherein the second side of the insulating substrate is covered with an insulating film, the elastic material layer is disposed over the insulating film, and the connecting pad section is exposed.

3. A substrate for inspecting an electronic device according to claim 1, wherein the side of the elastic material layer disposed furthest from the insulating layer is supported by a support member.

4. A substrate for inspecting an electronic device according to claim 1, further comprising a reinforcing member disposed on the first side of the second section of the insulating substrate.

5. A substrate for inspecting an electronic device according to claim 2, further comprising a reinforcing member disposed on the first side of the second section of the insulating substrate.

6. A substrate for inspecting an electronic device according to claim 3, further comprising a reinforcing member disposed on the first side of the second section of the insulating substrate.

7. A substrate for inspecting an electronic device according to claim 1, wherein a connecting bump is formed on the connecting pad section.

8. A substrate for inspecting an electronic device according to claim 2, wherein a connecting bump is formed on the connecting pad section.

9. A substrate for inspecting an electronic device according to claim 3, wherein a connecting bump is formed on the connecting pad section.

10. A substrate for inspecting an electronic device according to claim 4, wherein a connecting bump is formed on the connecting pad section.

11. A substrate for inspecting an electronic device according to claim 5, wherein a connecting bump is formed on the connecting pad section.

12. A substrate for inspecting an electronic device according to claim 6, wherein a connecting bump is formed on the connecting pad section.

13. A substrate for inspecting an electronic device according to claim 1, wherein a lead pin is joined to the connecting pad section.

14. A substrate for inspecting an electronic device according to claim 2, wherein a lead pin is joined to the connecting pad section.

15. A substrate for inspecting an electronic device according to claim 3, wherein a lead pin is joined to the connecting pad section.

16. A substrate for inspecting an electronic device according to claim 4, wherein a lead pin is joined to the connecting pad section.

17. A substrate for inspecting an electronic device according to claim 5, wherein a lead pin is joined to the connecting pad section.

18. A substrate for inspecting an electronic device according to claim 6, wherein a lead pin is joined to the connecting pad section.

19. A method of manufacturing a substrate for inspecting an electronic device comprising the steps of:

forming opening sections, the diameter of each opening being determined so that a connection terminal can be inserted into and drawn out from the opening, in a region, on which the electronic device is mounted, on a first side of an insulating substrate having a conductor layer on the second side, corresponding to an arrangement of the connection terminals, when a substrate for inspection used for electrically testing an electronic device having a bump-shaped connection terminal is manufactured;

exposing the conductor layer onto a bottom face of the opening section;

covering a surface of the conductor layer on the second side of the insulating substrate with photosensitive resist;

forming a resist pattern by exposing and developing photosensitive resist, the resist pattern covering a pad section exposed onto a bottom face of the opening section and coming into contact with the connecting terminal so that it can be electrically connected, the resist pattern also covering a connecting pad section formed in a region outside of the region in which the pad section is formed, the connecting pad section coming into contact with a contact terminal of an inspection device so as to accomplish electrical continuity, the resist pattern also covering a wiring pattern composed of a wiring section for electrically connecting the pad section and the connecting pad section;

forming a wiring pattern composed of the pad section, connecting pad section and wiring section when a portion in which the conductor layer is exposed is removed by means of etching while the resist pattern is being used as a mask, and covering the region in which the pad section is formed with an elastic material layer.

20. A method of manufacturing a substrate for inspecting an electronic device according to claim 19, wherein the opening section is formed when a laser beam is irradiated from one face side of the insulating substrate.

21. A method of inspecting an electronic device comprising the steps of:

putting, an electronic device, which is a body to be inspected, on a substrate for inspection described in claim 1 after the connecting terminals of the electronic device and the opening section of the substrate for inspection have been positioned suitably;

pressing the connecting terminals of the electronic device to the pad section exposed onto the bottom face of the opening section so as to accomplish electric continuity; and pressing the connecting pad section of the substrate for inspection to the contact terminals of the inspection device so as to accomplish electric continuity, so that the electronic device and the inspection device can be electrically connected with each other via the substrate for inspection of the electronic device and a predetermined electric test can be made.

22. A substrate for inspecting an electronic device according to claim 1, wherein the external face of the elastic layer is covered with metal or resin such that the elastic layer cannon be deformed.

23. A substrate for inspecting an electronic device according to claim 1, further comprising a reinforcing member disposed on the first side around the periphery of the insulating substrate.

* * * * *

UNITED STATES PATENT AND TRADEMARK OFFICE
CERTIFICATE OF CORRECTION

PATENT NO. : 6,404,214 B1
DATED : June 11, 2002
INVENTOR(S) : Muramatsu et al.

It is certified that error appears in the above-identified patent and that said Letters Patent is hereby corrected as shown below:

Column 12,
Line 4, change "cannon be deforemed" to -- cannot be deformed --.

Signed and Sealed this

Fifteenth Day of October, 2002

Attest:

Attesting Officer

JAMES E. ROGAN
Director of the United States Patent and Trademark Office